US009024525B2

(12) United States Patent
Furuie

(10) Patent No.: US 9,024,525 B2
(45) Date of Patent: May 5, 2015

(54) ORGANIC LUMINESCENT DISPLAY DEVICE AND METHOD OF MANUFACTURING AT ORGANIC LUMINESCENT DISPLAY DEVICE

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 63 days.

(21) Appl. No.: 14/031,105

(22) Filed: Sep. 19, 2013

(65) Prior Publication Data
US 2014/0091704 A1 Apr. 3, 2014

(30) Foreign Application Priority Data
Sep. 28, 2012 (JP) .................. 2012-216797

(51) Int. Cl.
  H01L 51/52 (2006.01)
  H01L 51/56 (2006.01)
  H05B 33/02 (2006.01)
  H01L 27/32 (2006.01)

(52) U.S. Cl.
  CPC .......... H05B 33/02 (2013.01); *H01L 51/5218* (2013.01); *H01L 51/524* (2013.01); H01L 51/5284 (2013.01); H01L 51/56 (2013.01); *H01L 27/322* (2013.01); *H01L 27/3244* (2013.01); *H01L 2251/5315* (2013.01)

(58) Field of Classification Search
  CPC .............. H01L 51/56; H01L 51/524–51/5259; H01L 2251/00–2251/568; H01L 27/32–27/3297
  USPC ................................ 313/500–512; 445/24, 25
  See application file for complete search history.

(56) References Cited

U.S. PATENT DOCUMENTS

| 7,839,073 B2* | 11/2010 | Yoshinaga | 313/503 |
| 2008/0157082 A1* | 7/2008 | Yang et al. | 257/59 |
| 2009/0128020 A1* | 5/2009 | Takei et al. | 313/504 |
| 2009/0195152 A1* | 8/2009 | Sawano | 313/504 |

FOREIGN PATENT DOCUMENTS

JP 2012-8200 A 1/2012

* cited by examiner

*Primary Examiner* — Mariceli Santiago
(74) *Attorney, Agent, or Firm* — Lowe Hauptman & Ham, LLP

(57) ABSTRACT

An organic EL display device of the invention includes: a first substrate; a second substrate disposed above the first substrate and having a display area and a non-display area; and a light-emitting layer disposed between the display area and the first substrate, wherein a first alignment mark having the light-emitting layer is disposed between the non-display area and the first substrate, and a second alignment mark is disposed on the second substrate at a position corresponding to the first alignment mark.

11 Claims, 11 Drawing Sheets

ORGANIC LUMINESCENT DISPLAY DEVICE AND METHOD OF MANUFACTURING AT ORGANIC LUMINESCENT DISPLAY DEVICE

CROSS-REFERENCE TO RELATED APPLICATION

The present application claims priority from Japanese application JP 2012-216797 filed on Sep. 28, 2012, the content of which is hereby incorporated by reference into this application.

BACKGROUND OF THE INVENTION

1. Field of the Invention

The present invention relates to an organic EL display device and a method of manufacturing an organic EL display device.

2. Description of the Related Art

As a thin and lightweight light-emitting source, an organic light-emitting diode, that is, an organic EL (electro luminescent) element is attracting attention, and an image display device including a number of organic EL elements has been developed. The organic EL element has a structure in which at least one layer of organic thin film formed of an organic material is interposed between a pixel electrode and a counter electrode.

An organic EL display device having organic EL elements includes, for example, an element substrate having the organic EL elements arranged in a matrix corresponding to pixels and a counter substrate provided so as to face the element substrate. On such a counter substrate, color filters arranged in a matrix corresponding to the pixels and the like are formed. Since the organic EL display device has the configuration described above, light emitted from the organic EL element is directed from the element substrate toward the counter substrate side, transmits through the color filter, and exits to the outside. Moreover, at an outer periphery of the color filter, a black matrix is usually disposed as a light-impermeable film for preventing mixing of light emitted from the organic EL elements next to each other.

JP 2012-008200 A discloses, in a method of manufacturing a display device such as the organic EL display device described above, a method of overlaying an alignment mark disposed on one of substrates on an alignment mark disposed on the other substrate, as alignment of two substrates such as the element substrate and the counter substrate.

SUMMARY OF THE INVENTION

In the alignment using the alignment marks respectively disposed on two substrates, it is necessary in every alignment of the substrates to irradiate the substrate with light from the outside thereof using a light or the like and recognize an image of the alignment marks using a camera or the like from the side opposite to the irradiation direction. Therefore, the manufacturing process of the organic EL display device becomes complicated.

The invention has been made in view of the circumstances described above, and it is an object of the invention to provide a method of manufacturing an organic EL display device, by which the manufacturing process of the organic EL display device can be simplified, and an organic EL display device.

(1) An organic EL display device according to an aspect of the invention includes: a first substrate; a second substrate disposed above the first substrate and having a display area and a non-display area; and a light-emitting layer disposed between the display area and the first substrate, wherein a first alignment mark having the light-emitting layer is disposed between the non-display area and the first substrate, and a second alignment mark is disposed on the second substrate at a position corresponding to the first alignment mark.

(2) In the organic EL display device according to (1), a light-impermeable film may be disposed in the non-display area, and the second alignment mark may be formed of an opening disposed in the light-impermeable film.

(3) In the organic EL display device according to (2), the opening may be located in plan view inside an outer periphery of the first alignment mark.

(4) In the organic EL display device according to any one of (1) to (3), the first alignment mark may have an electrode underlying the light-emitting layer.

(5) In the organic EL display device according to (4), a portion of the light-emitting layer of the first alignment mark may not be electrically connected to the electrode.

(6) In the organic EL display device according to (4) or (5), the organic EL display device may further include, between the first substrate and the electrode: a first insulating film; a wire disposed on the first insulating film and connected to the electrode; and a second insulating film disposed on the wire.

(7) In the organic EL display device according to (6), a power supply supplying electricity to the electrode via the wire may be disposed.

(8) In the organic EL display device according to any one of (4) to (7), the first alignment mark may have a reflection film underlying the electrode.

(9) A method of manufacturing an organic EL display device according to another aspect of the invention includes the steps of: disposing, on a first substrate, a first alignment mark having a light-emitting layer; and providing, on the light-emitting layer, a second substrate disposed with a second alignment mark at a position corresponding to the first alignment mark and having a display area and a non-display area, wherein in the step of disposing the first alignment mark, the first alignment mark is disposed in an area corresponding to the non-display area, and in the step of providing the second substrate on the light-emitting layer, alignment of the second substrate is performed while causing the first alignment mark to emit light.

(10) In the method of manufacturing the organic EL display device according to (9), the alignment may be performed so that an opening, as the second alignment mark, in a light-impermeable film disposed in the non-display area is located in plan view inside an outer periphery of the first alignment mark.

(11) In the method of manufacturing the organic EL display device according to (10), the method may further include, in the step of disposing the first alignment mark, the steps of: disposing an electrode on the first substrate; disposing an insulator covering a portion of the electrode; and disposing the light-emitting layer so as to cover an upper surface of the electrode and the insulator, wherein the alignment may be performed so that the insulator is located inside the opening.

DETAILED DESCRIPTION OF THE INVENTION

Figure 1:
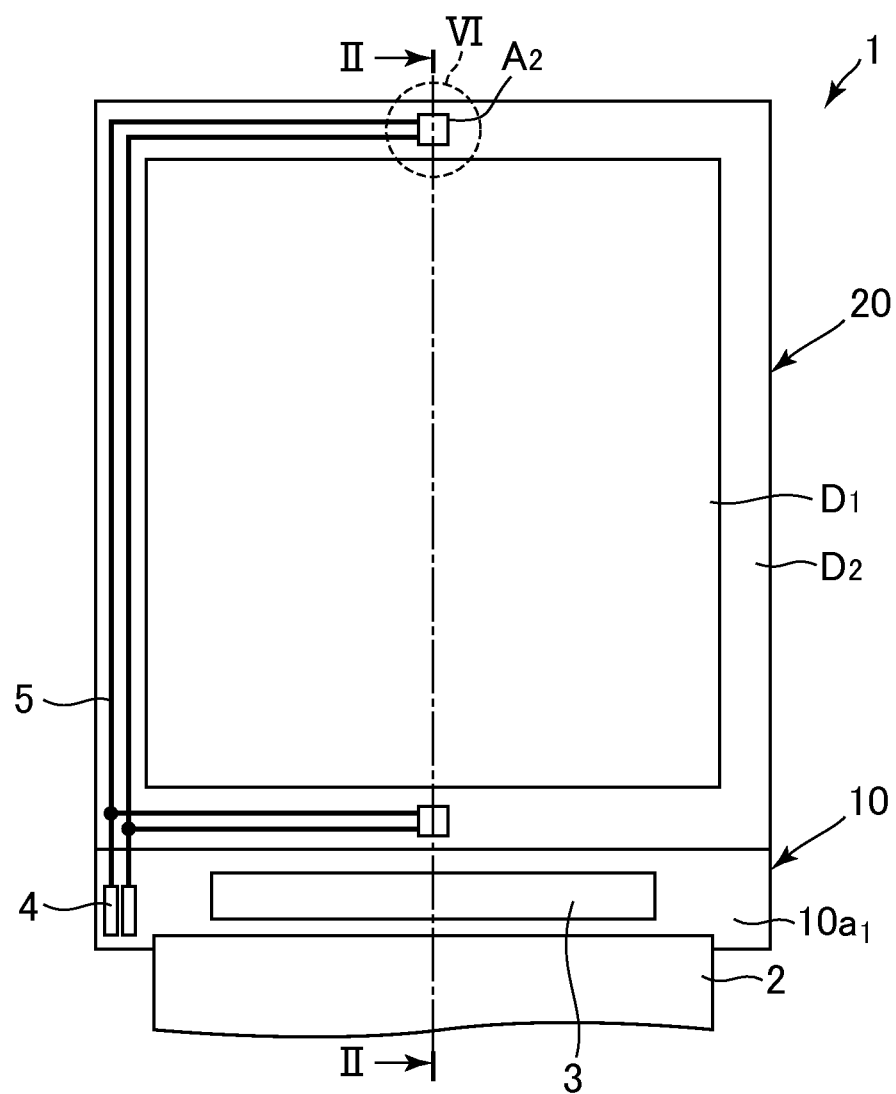
FIG. 1 is a schematic plan view of an organic EL display device according to a first embodiment of the invention.

Hereinafter, embodiments of the invention will be described based on the drawings. In components appearing in the specification, components having the same function are denoted by the same reference numeral and sign, and the description thereof is omitted. In the drawings referred to in the following description, a portion having a feature is sometimes shown in an enlarged manner for convenience sake for facilitating the understanding of the feature. Therefore, the dimension ratio of each component is not always the same as a real one. Moreover, materials or the like illustrated in the following description are illustrative only. Each component may be different from the illustrated one and can be implemented by modification within a range not changing the gist thereof.

Figure 2:
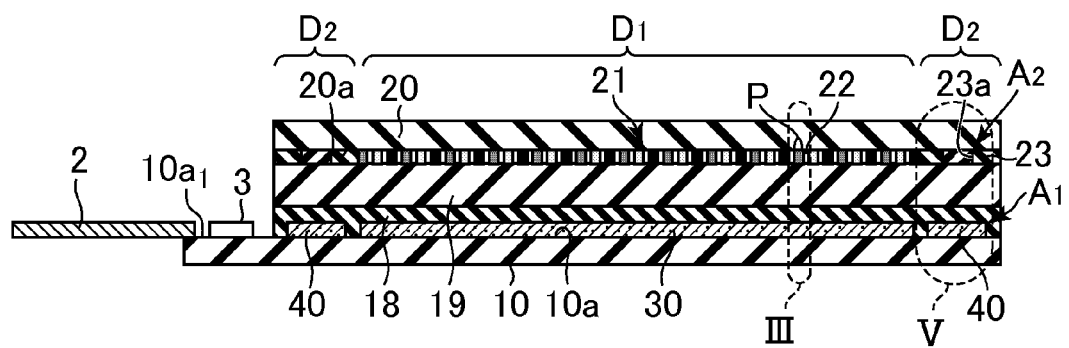
FIG. 2 is a schematic cross-sectional view of the organic EL display device according to the first embodiment taken along line II-II.

First, an organic EL display device 1 according to a first embodiment of the invention will be described. FIG. 1 is a schematic plan view of the organic EL display device 1 according to the first embodiment of the invention. FIG. 2 is a schematic cross-sectional view of the organic EL display device 1 taken along line II-II in FIG. 1. The organic EL display device 1 according to the embodiment includes a first substrate 10 and a second substrate 20 disposed above the first substrate 10 and having a display area D1 and a non-display area D2.

The first substrate 10 is, for example, a rectangular substrate (hereinafter referred to as low-temperature polysilicon substrate) formed with a low-temperature polysilicon layer. The first substrate 10 has a plurality of first organic EL elements (light-emitting elements) 30 disposed on an upper surface 10a in an area corresponding to the display area D1 and second organic EL elements 40 disposed on the upper surface 10a in an area corresponding to the non-display area D2. The low-temperature polysilicon as used herein means polysilicon formed under the condition of 600° C. or less. The upper surface 10a of the first substrate 10, the first organic EL elements 30, and the second organic EL elements 40 are covered with a sealing film 18. Each of the second organic EL elements 40 constitutes a first alignment mark A1 described later.

On the upper surface 10a of the first substrate 10, a flexible circuit board 2 is connected in an area $10a_1$ not provided with the second substrate 20. Further, a driving driver 3 and power supplies (probe contacts) 4 are disposed in the area $10a_1$. The driving driver 3 is a driver supplied with image data from the outside of the organic EL display device 1 via the flexible circuit board 2. With the supply of image data, the driving driver 3 supplies, via a data line (not shown), display data to each of pixels of the organic EL elements 30.

In the area corresponding to the non-display area D2 on the first substrate 10, a wire 5 connecting the probe contact 4 with the first alignment mark A1 is disposed. With the configuration described above, electricity is supplied to an electrode of the first alignment mark A1 via the wire 5 by the application of a voltage to the probe contact 4.

The second substrate 20 is, for example, a glass substrate having an outer periphery smaller than that of the first substrate 10 in plan view, and disposed above the first substrate 10 via an adhesion layer 19.

The second substrate 20 has the display area D1 and the non-display area D2. The display area D1 is an area disposed with a color filter 21. The color filter 21 is composed of a plurality of sub-pixels (pixels) P expressing different colors from each other such as, for example, red (R), green (G), and blue (B). The color filter 21 is partitioned every pixel P by a first light-impermeable film 22 formed of, for example, a black matrix.

The non-display area D2 is an area around the display area D1, and covered with a second light-impermeable film 23 formed of, for example, a black matrix. In the second light-impermeable film 23, an opening 23a as a second alignment mark A2 is disposed at a position corresponding to each of the first alignment marks A1. As shown in FIG. 1 for example, the second alignment mark A2 is disposed at the center of each of facing short sides of the second substrate 20.

Figure 3:
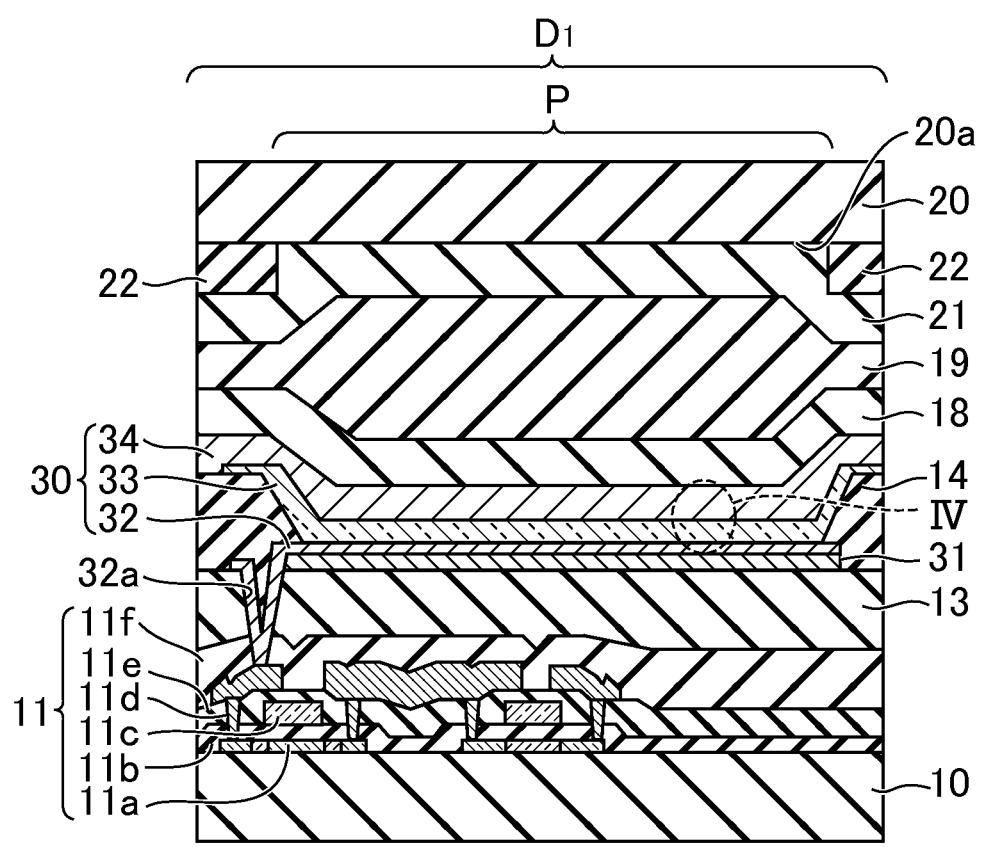
FIG. 3 is a partially enlarged view of an area III of the organic EL display device shown in FIG. 2.

Next, the configuration of the display area D1 of the organic EL display device 1 will be described in detail. FIG. 3 is a partially enlarged view of an area III of the organic EL display device 1 shown in FIG. 2. The area III is an area corresponding to one pixel P in the display area D1. On the first substrate 10 of the area III, a thin film transistor 11, the first organic EL element 30, the sealing film 18, the adhesion layer 19, the color filter 21, and the second substrate 20 are stacked.

The thin film transistor 11 is a transistor for driving the first organic EL element 30, and disposed on the first substrate 10 in each of the pixels P. The thin film transistor 11 is composed of a gate line (gate electrode) 11a, a gate insulating layer 11b, a polysilicon semiconductor layer 11c, a source/drain electrode 11d, a first insulating film 11e, and a second insulating film 11f.

An upper surface of the thin film transistor 11 is covered with a passivation layer 13 formed of an insulator. The passivation layer 13 is formed of, for example, $SiO_2$, SiN, an acrylic resin, a polyimide, or the like. Since the passivation layer 13 is disposed on the thin film transistor 11 in this manner, the thin film transistors 11 of the pixels P next to each other, or the thin film transistor 11 and the first organic EL element 30 are electrically insulated from each other.

A reflection film 31 is disposed on the passivation layer 13. The reflection film 31 is disposed for reflecting light that is emitted from the first organic EL element 30 to the first substrate 10 side toward the color filter 21 side, that is, toward the second substrate 20. The reflection film 31 preferably has higher optical reflectance. For the reflection film 31, a metal film formed of, for example, aluminum, silver, or the like can be used.

The first organic EL element 30 is disposed on the reflection film 31. The first organic EL element 30 is schematically composed of an anode 32 as one of electrodes, an organic layer 33, and a cathode 34 as the other electrode.

The anodes 32 are provided in a matrix each corresponding to an area of each of the pixels P. The anode 32 is formed of a material having translucency and conductivity such as, for example, ITO (Indium Tin Oxide), and formed so as to cover the reflection film 31. The anode 32 is electrically connected to the thin film transistor 11 via a contact hole 32a disposed through the passivation layer 13 and the second insulating film 11f. With the configuration described above, a driving current supplied from the thin film transistor 11 is injected into the organic layer 33.

Between the anodes 32 next to each other, a bank 14 formed of an insulator is formed. When the organic layer 33 is formed every pixel P, the bank 14 is preferably disposed so as to surround the outer periphery of the anode 32. Since the bank 14 is disposed in this manner, contact between the anodes 32 next to each other is prevented. Moreover, a leakage current between the anode 32 and the cathode 34 is prevented.

Figure 4:
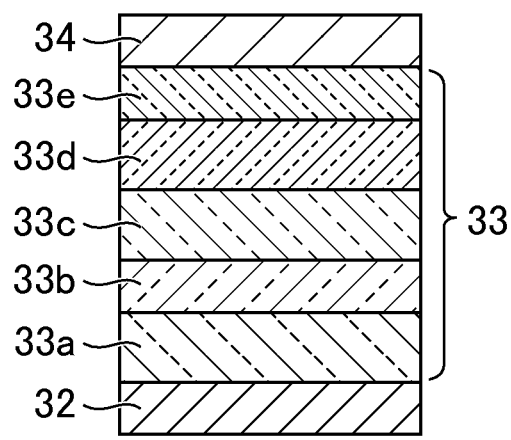
FIG. 4 is a partially enlarged view of an area IV shown in FIG. 3.

FIG. 4 is a partially enlarged view of an area IV shown in FIG. 3. The organic layer 33 is disposed on the anode 32. The organic layer 33 includes, for example, a hole-injection layer 33a, a hole transport layer 33b, a light-emitting layer 33c, an electron transport layer 33d, and an electron-injection layer 33e stacked in this order from the anode 32 side. The stacked structure of the organic layer 33 is not limited to that mentioned herein. The stacked structure is not specified as long as it includes at least the light-emitting layer 33c.

The hole-injection layer 33a and the hole transport layer 33b have a function of transporting holes injected from the anode 32 to the light-emitting layer 33c. The light-emitting layer 33c is composed of, for example, an organic EL material that emits light in response to the combination of holes and electrons. The organic layer 33 may emit white light or another color light. The electron-injection layer 33e and the electron transport layer 33d have a function of transporting electrons injected from the cathode 34 to the light-emitting layer 33c.

As shown in FIG. 3, the cathode 34 is formed so as to cover the organic layer 33. The cathode 34 is a common electrode contacting in common the organic layers 33 of the plurality of organic EL elements 30. The cathode 34 is formed of a material having translucency and conductivity such as, for example, ITO.

An upper surface of the cathode 34 is covered with the sealing film 18. The sealing film 18 is formed of, for example, SiN, SiO, SiON, a resin, or the like, and may be a single-layer film or stacked structure formed of these materials.

On the sealing film 18, the adhesion layer 19 for fixing the second substrate 20 to the first substrate 10 is disposed. The adhesion layer 19 is formed of a resin or the like that is cured by heat, UV light, or the like, such as, for example, an epoxy resin. The material of the adhesion layer 19 may be one type of resin or a plurality of resins that are stacked on top of another. The adhesion layer 19 may be an adhesive double-faced tape as long as it can fix the second substrate 20 to the first substrate 10.

The second substrate 20 is provided on the adhesion layer 19. The second substrate 20 is a substrate located on an image display surface side, and formed of a translucent material such as, for example, glass, quartz, or plastic. On a lower surface 20a of the second substrate 20, the color filter 21 and the first light-impermeable film 22 that partitions the color filter 21 every pixel P are disposed. The light-impermeable film 22 is formed of a film having a light-shielding property, such as a metal film formed of, for example, Cr.

The color filter 21 is formed so as to cover the lower surface 20a of the second substrate 20 and the first light-impermeable film 22. The color filter 21 is formed of a light-permeable resin material or the like, and colored into a plurality of colors such as, for example, red (R), green (G), and blue (B) with, for example, a pigment or the like pixel P by pixel P. The color filter 21 is arranged in a matrix corresponding to areas of the pixels P. With the configuration described above, the first light-impermeable film 22 prevents light emitted from each of the organic EL elements 30 from being incident on the color filter 21 of the next pixel P. Moreover, since a lower surface of the color filter 21 is adhered to the sealing film 18 with the adhesion layer 19, the second substrate 20 is fixed to the first substrate 10.

Figure 5:
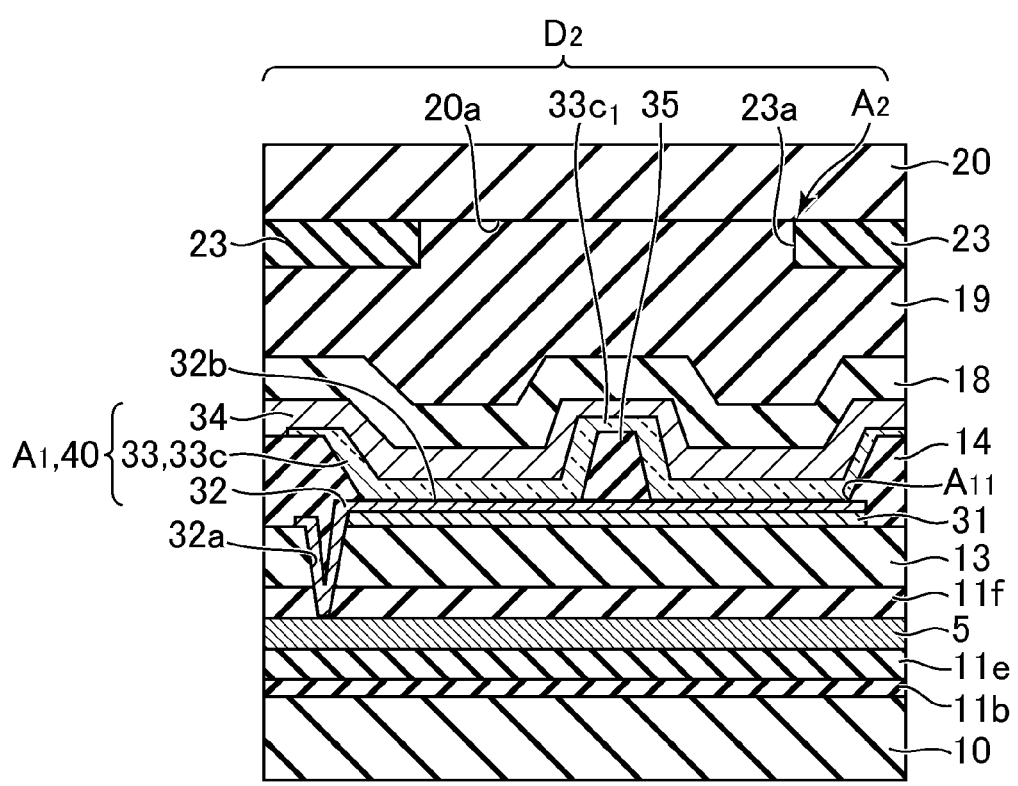
FIG. 5 is a partially enlarged view of an area V of the organic EL display device shown in FIG. 2.

Next, the configuration of the non-display area D2 of the organic EL display device 1 will be described in detail. FIG. 5 is a partially enlarged view of an area V of the organic EL display device 1 shown in FIG. 2. The area V corresponds to an area where the first alignment mark A1 and the second alignment mark A2 are disposed in the non-display area D2. In the following, detailed descriptions of configurations similar to those of the display area D1, which have been described with reference to FIGS. 3 and 4, are omitted.

Above the first substrate 10 of the area V, the wire 5, the first alignment mark A1 having the second organic EL element 40, the adhesion layer 19, and the second substrate 20 disposed with the second alignment mark A2 are stacked. The configuration of the non-display area D2 differs from that of the display area D1 in that the thin film transistor 11 is not formed in the area V.

The wire 5 is disposed above the first substrate 10 via the gate insulating layer 11b and the first insulating film 11e.

The first alignment mark A1 has the second organic EL element 40. The second organic EL element 40 is disposed above the wire 5 via the second insulating film 11f, the passivation layer 13, and the reflection film 31.

The second organic EL element 40 is a passively driven organic EL element, and schematically composed of the anode 32, the organic layer 33 having the light-emitting layer 33c, and the cathode 34. In the second organic EL element 40, similarly to the first organic EL element 30, the anode 32 is formed so as to underlie the light-emitting layer 33c, while the cathode 34 is formed so as to overlie the organic layer 33. With the configuration described above, the light-emitting layer 33c is electrically connected to the anode 32.

It is preferable that a portion of an upper surface 32b of the anode 32 is covered with an insulating portion 35 formed of an insulating material, and that the upper surface 32b of the anode 32 and the insulating portion 35 are covered with the organic layer 33. With the configuration described above, the light-emitting layer 33c ($33c_1$) corresponding to an area disposed with the insulating portion 35 is an area not electrically connected to the anode 32. That is, a portion $33c_1$ of the light-emitting layer 33c of the first alignment mark A1 is an area not electrically connected to the anode 32.

An outer periphery A11 of the first alignment mark A1 in the embodiment is defined as an outer periphery of a light-emitting area of the light-emitting layer 33c. According to this configuration, the outer periphery A11 is an outer periphery of an area where the anode 32 and the organic layer 33 (the light-emitting layer 33c) are electrically connected to each other.

An upper surface of the first alignment mark A1 (an upper surface of the cathode 34) is covered with the sealing film 18 and the adhesion layer 19. On the adhesion layer 19, the second substrate 20 is provided. A portion of the lower surface 20a of the non-display area D2 of the second substrate 20 is covered with the second light-impermeable film 23 such as, for example, a black matrix.

The second alignment mark A2 is disposed on the second substrate 20 at a position corresponding to the first alignment mark A1. The second alignment mark A2 in the embodiment is formed of the opening 23a disposed in the second light-impermeable film 23.

Figure 6:
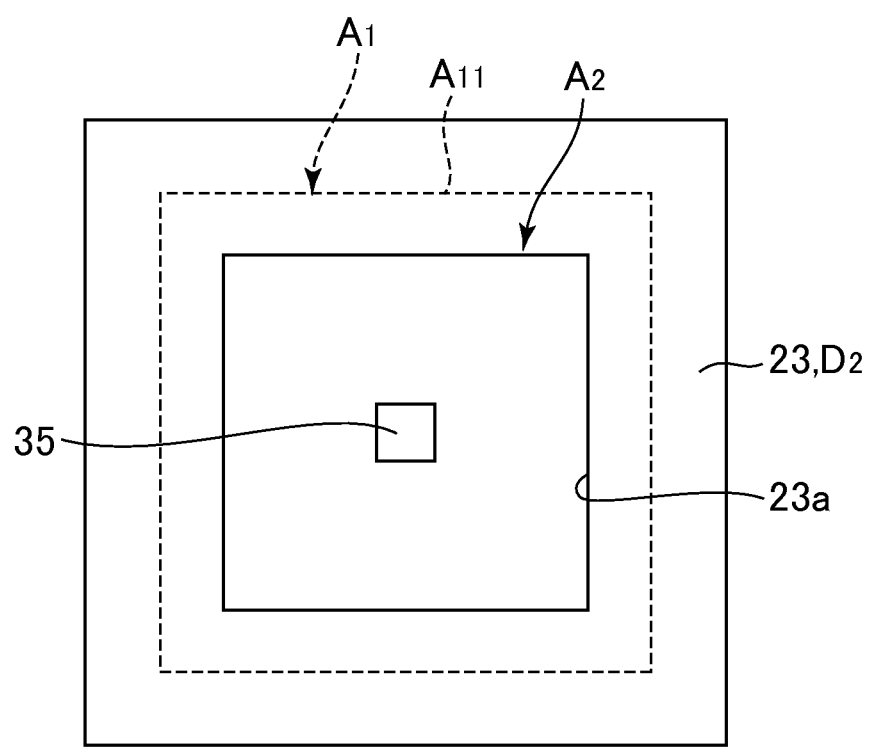
FIG. 6 is a partially enlarged view of an area VI of the organic EL display device shown in FIG. 1.

FIG. 6 is a partially enlarged view of an area VI of the organic EL display device 1 shown in FIG. 1. Moreover, FIG. 6 shows the second alignment mark A2 and the first alignment mark A1 as viewed in plan view from the outside of the second substrate 20. As shown in FIG. 6, the second alignment mark A2 (the opening 23a of the second light-impermeable film 23) is located in plan view inside the outer periphery A11 of the first alignment mark A1.

The plan-view shape of each of the second alignment mark A2 and the first alignment mark A1 shown in FIG. 6 is rectangular, but it is not limited thereto. The second alignment mark A2 and the first alignment mark A1 may have other shapes as long as the second alignment mark A2 is located inside the outer periphery A11 of the first alignment mark A1.

The insulating portion 35 is located in plan view inside the opening 23a. It is preferable that the position of the insulating portion 35 is located in plan view closer to the center inside the opening 23a.

In the organic EL display device 1 in the embodiment, the first alignment mark A1 having the light-emitting layer 33c is disposed between the non-display area D2 of the second substrate 20 and the first substrate 10, while the second alignment mark A2 is disposed on the second substrate 20 at the position corresponding to the first alignment mark A1. Therefore, when viewed from a plan-view direction as shown in FIG. 6, a viewer can visually recognize the second alignment mark A2 by causing the second organic EL element 40 of the first alignment mark A1 to emit light.

Therefore, there is no need to secure a light-transmitting area around an area corresponding to the second alignment mark A2. Due to this, compared to an organic EL display device not having the configuration, the width of the non-display area D2 can be narrowed. Therefore, it is possible to realize the organic EL display device 1 with a narrow edge.

In the organic EL display device 1 in the embodiment, since the first alignment mark A1 has the anode 32 underlying the light-emitting layer 33c, the light-emitting layer 33c is electrically connected to the anode 32. With the configuration described above, by supplying electricity from the probe contact 4 to the anode 32 and the cathode 34 via the wire 5, the light-emitting layer 33c can be caused to emit light.

Since the second light-impermeable film 23 is disposed in the non-display area D2 and the second alignment mark A2 is formed of the opening 23a disposed in the second light-impermeable film 23, the light emitted from the first alignment mark A1 transmits through the opening 23a. Since the opening 23a is located in plan view inside the outer periphery A11 of the first alignment mark A1, the light emitted from the first alignment mark A1 is blocked at an area where the first alignment mark A1 and the second light-impermeable film 23 overlap each other.

With the configuration described above, the viewer can visually recognize that the second alignment mark A2 is located in plan view inside the outer periphery A11 of the first alignment mark A1 by causing the first alignment mark A1 to emit light. Therefore, compared to an organic EL display device not having the configuration, it is possible to realize the organic EL display device 1 in which the accuracy of bonding between the first substrate 10 and the second substrate 20 is high.

In the organic EL display device 1 in the embodiment, since the insulating portion 35 is disposed, the viewer can visually recognize, by causing the first alignment mark A1 to emit light, that the portion $33c_1$ of the light-emitting layer $33c$ is located inside the opening 23a of the second alignment mark A2. Therefore, compared to an organic EL display device not having the configuration, it is possible to realize the organic EL display device 1 in which the accuracy of bonding between the first substrate 10 and the second substrate 20 is high. Hence, the area of the display area D1 can be largely secured. Moreover, since the accuracy of bonding between the first substrate 10 and the second substrate 20 is high, it is possible to prevent the occurrence of a defect due to color mixture or the like.

In the organic EL display device 1 in the embodiment, since the second organic EL element 40 is disposed on the reflection film 31, the light emitted from the light-emitting layer 33c is reflected by the reflection film 31 located therebelow, and directed upward. Therefore, compared to an organic EL display device not having the configuration, the viewer visually recognizes easily the first alignment mark A1 and the second alignment mark A2.

Moreover, since the reflection film 31 is provided, light incident from the outside of the second substrate 20 is reflected by the reflection film 31 and not transmitted downward through the first substrate 10. Therefore, it is possible to realize the non-display area D2 not having a light-transmitting point.

Next, an organic EL display device 1 according to a second embodiment of the invention will be described. The organic EL display device 1 according to the second embodiment differs from that of the first embodiment in that a second alignment mark A2 is formed of a non-display area D2 located in plan view inside an outer periphery A11 of a first alignment mark A1. In the following, detailed descriptions of configurations similar to those of the organic EL display device 1 in the first embodiment are omitted.

Figure 7:
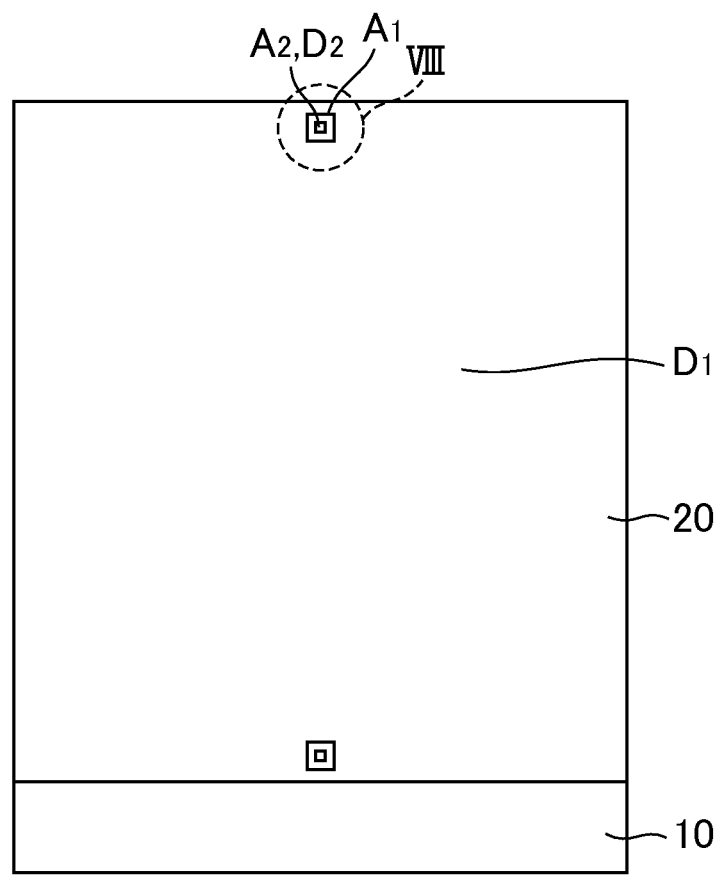
FIG. 7 is a schematic plan view of an organic EL display device according to a second embodiment of the invention.

FIG. 7 is a schematic plan view of the organic EL display device 1 according to the second embodiment of the invention. As shown in FIG. 7, the non-display area D2 of a second substrate 20 in the embodiment has only an area corresponding to the second alignment mark A2. As such the second substrate 20, a substrate whose entire surface is transparent, such as a touch panel or a front window, can be used.

Figure 8:
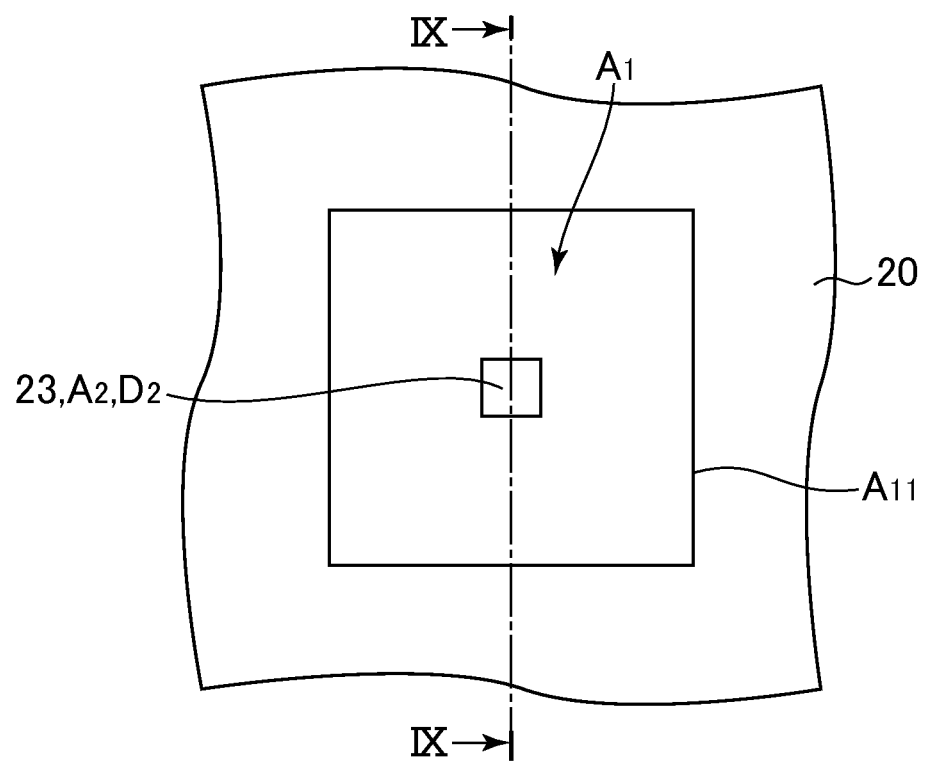
FIG. 8 is a partially enlarged view of an area VIII of the organic EL display device shown in FIG. 7.
Figure 9:
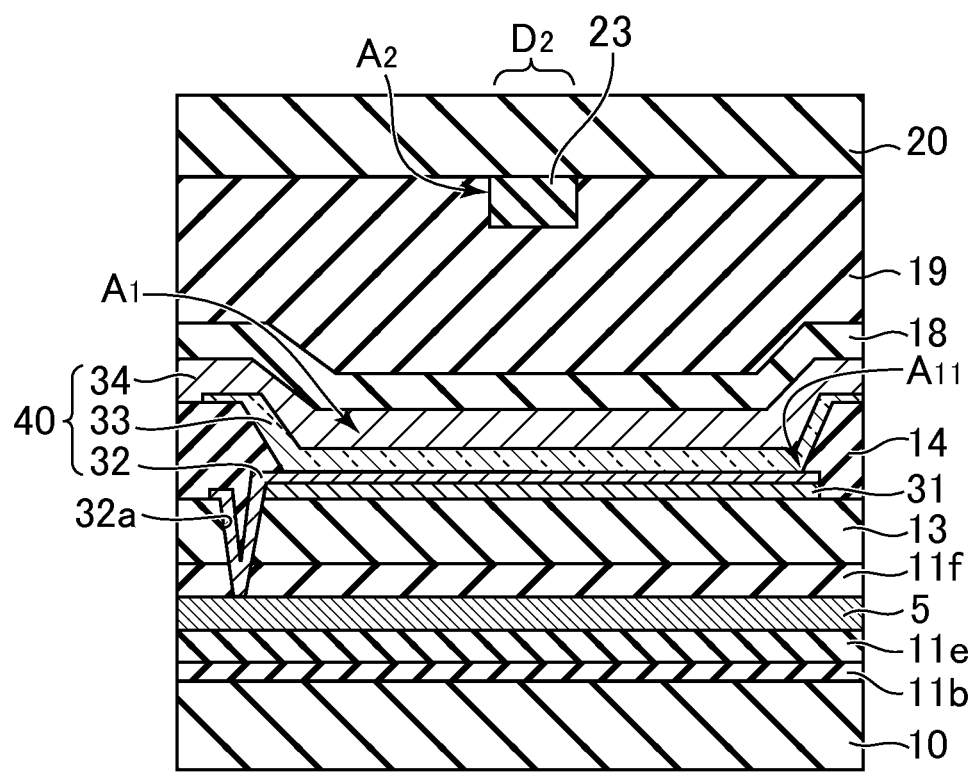
FIG. 9 is a schematic cross-sectional view of the organic EL display device shown in FIG. 8 taken along line IX-IX.

FIG. 8 is a partially enlarged view of an area VIII of the organic EL display device 1 shown in FIG. 7. FIG. 9 is a schematic cross-sectional view of the organic EL display device 1 taken along line IX-IX shown in FIG. 8. The first alignment mark A1 in the embodiment is formed of a second organic EL element 40. The second alignment mark A2 is formed of a second light-impermeable film 23 disposed on the second substrate 20 at a position corresponding to the first alignment mark A1. The second light-impermeable film 23 is located in plan view inside the outer periphery A11 of the first alignment mark A1. The area disposed with the second light-impermeable film 23 constitutes the non-display area D2.

With the configuration described above, when the first alignment mark A1 is caused to emit light, the light emitted from the first alignment mark A1 to the second substrate 20 side is blocked by the second alignment mark A2. Therefore, the viewer can visually recognize that the second alignment mark A2 is located in plan view inside the outer periphery A11 of the first alignment mark A1.

Accordingly, even when a substrate whose entire surface is transparent is used as the second substrate 20, it is possible to realize the organic EL display device 1 in which the accuracy of bonding between the first substrate 10 and the second substrate 20 is high, and prevent the occurrence of a defect due to color mixture or the like.

While the organic EL display device 1 of the invention has been described so far, the positions of the first alignment mark A1 and the second alignment mark A2 are not limited to the arrangements illustrated in FIGS. 1 and 7. For example, when the first substrate 10 and the second substrate 20 are each a rectangle having two short sides and two long sides, the alignment marks may be disposed, not only in the vicinity of the center of each of the facing short sides as shown in FIGS. 1 and 7, but also at the facing long sides.

Moreover, the first alignment mark A1 and the second alignment mark A2 may be disposed, not only at the sides of the first substrate 10 and the second substrate 20, but also at, for example, two diagonal corners of the four corners or all of the four corners. Moreover, the arrangement of the first alignment mark A1 and the second alignment mark A2 is not limited to that mentioned herein, but it is sufficient that the first alignment mark A1 and the second alignment mark A2 are provided at two or more points of each of the first substrate 10 and the second substrate 20. It is particularly preferable that the first alignment mark A1 and the second alignment mark A2 are provided in plan view at facing positions with respect to the centers of the first substrate 10 and the second substrate 20.

Next, a method of manufacturing the organic EL display device 1 according to one embodiment of the invention will be described. The method of manufacturing the organic EL display device in the embodiment includes: a step of preparing the first substrate 10 and the second substrate 20 disposed with the second alignment marks A2 and having the display area D1 and the non-display area D2; a step of disposing, on the first substrate 10, the first alignment marks A1 each having the light-emitting layer 33c; and providing the second substrate 20 above the light-emitting layer 33c.

Figure 10:
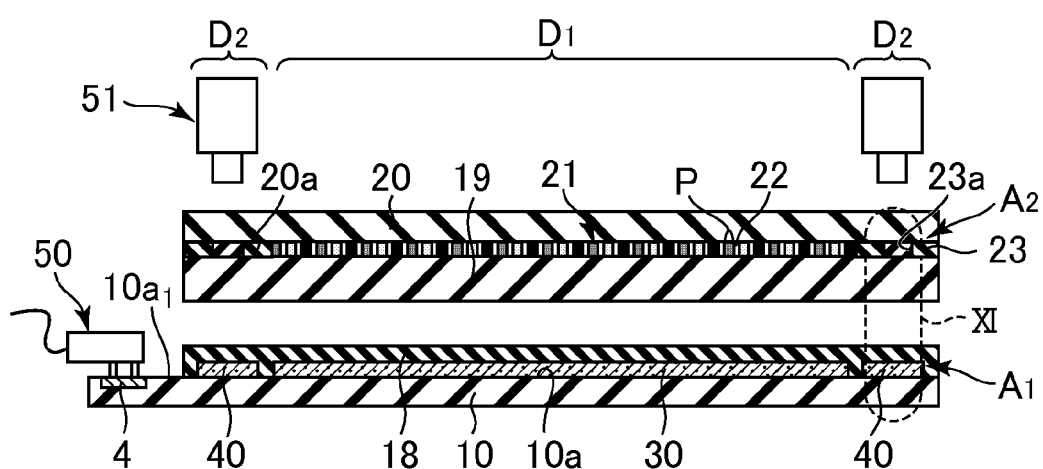
FIG. 10 is a schematic cross-sectional view showing a method of manufacturing an organic EL display device according to one embodiment of the invention.
Figure 11:
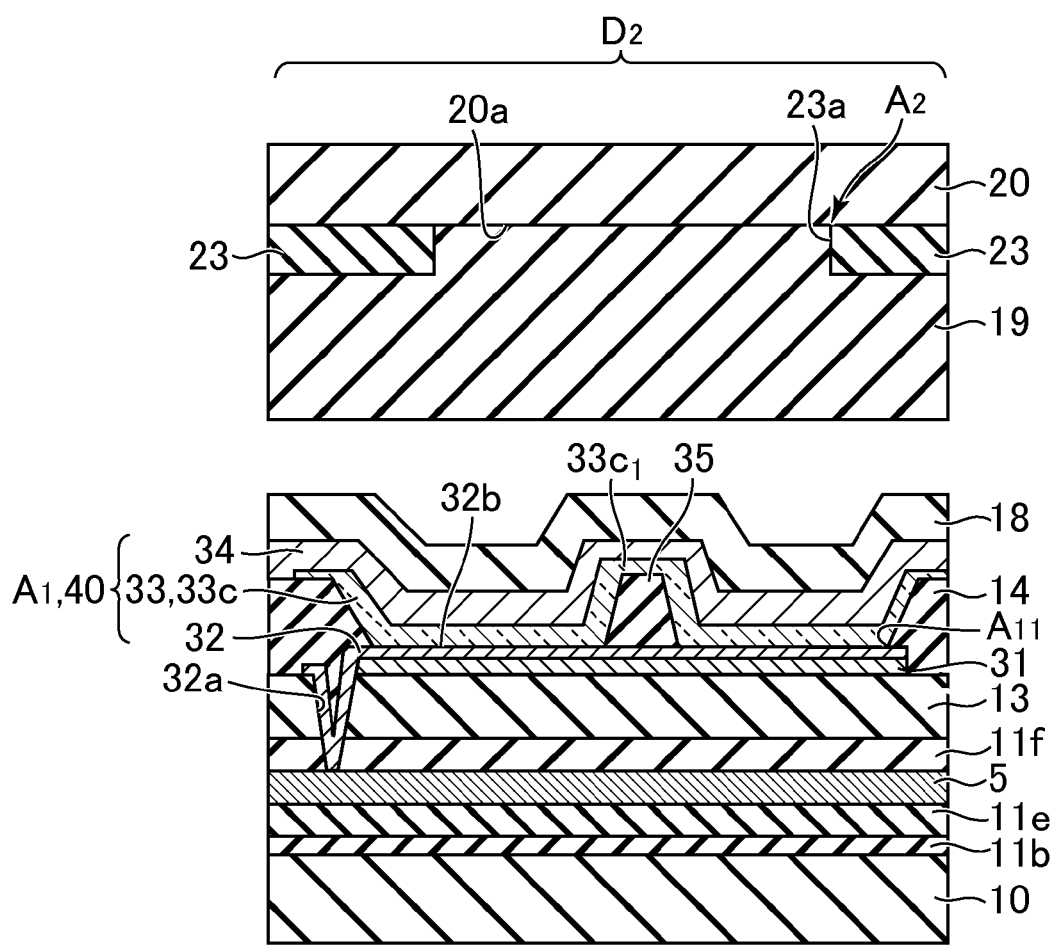
FIG. 11 is a partially enlarged view of an area XI of the organic EL display device shown in FIG. 10.

FIG. 10 is a schematic cross-sectional view showing the method of manufacturing the organic EL display device 1 according to the first embodiment of the invention, showing the first substrate 10 and the second substrate 20 in the same view as FIG. 2. FIG. 11 is a partially enlarged view of an area XI of the organic EL display device shown in FIG. 10. For convenience of description, a probe 50 is shown in FIG. 10.

First, the first substrate 10 that is, for example, a rectangular low-temperature polysilicon substrate, and the second substrate 20 disposed with the display area D1 and the non-display area D2 and having an outer periphery smaller than that of the first substrate 10 in plan view are prepared. In the display area D1, the color filter 21 is disposed. Moreover, the color filter 21 is partitioned every pixel P by the first light-impermeable film 22.

In the non-display area D2, the second light-impermeable film 23 having the second alignment mark A2 is disposed. The second alignment mark A2 is formed of, for example, the opening 23a disposed in the second light-impermeable film 23, and disposed at a position corresponding to the first alignment mark A1 described later.

Next, the probe contact 4 is disposed in the area $10a_1$ on one surface (upper surface) of the first substrate 10. Next, the thin film transistor 11 (not shown) is formed in an area corresponding to the display area D1 on the upper surface of the first substrate 10, while the gate insulating layer 11b, the first insulating film 11e, and the wire 5 are successively formed in an area corresponding to the non-display area D2.

Next, the second insulating film 11f and the passivation layer 13 are successively formed so as to cover an upper surface of the wire 5. Next, the reflection film 31 is formed in an area corresponding to the pixels P of the display area D1 and in an area corresponding to the second alignment marks A2 of the non-display area D2.

Next, the first organic EL elements 30 are disposed above the first substrate 10 in the area corresponding to the display area D1, while the first alignment marks A1 each having the second organic EL element 40 are disposed above the first substrate 10 in the area corresponding to the non-display area D2.

First, the anode 32 formed of ITO (Indium Tin Oxide) or the like is formed so as to cover the reflection film 31 formed in each of the display area D1 and the non-display area D2. The anode 32 formed in the display area D1 is connected to the thin film transistor 11 via the contact hole 32a, while the anode 32 formed in the non-display area D2 is connected to the wire 5 via the contact hole 32a.

Next, the bank 14 formed of an insulating material and surrounding the anode 32 in each of the display area D1 and the non-display area D2 is formed. Next, the organic layer 33 is formed so as to cover the anode 32 by successively vapor-depositing, for example, the hole-injection layer, the hole transport layer, the light-emitting layer 33c, the electron transport layer, and the electron-injection layer. The stacked structure of the organic layer 33 is not limited to that mentioned herein. The stacked structure is not specified as long as it includes at least the light-emitting layer 33c. The method of forming the organic layer 33 is not limited to vapor deposition, and applying means such as an ink jet may be used.

Before forming the organic layer 33, the insulating portion 35 covering a portion of the upper surface 32b of the anode 32 may be formed. After forming the insulating portion 35, the upper surface 32b of the anode 32 and the insulating portion 35 are covered with the organic layer 33, whereby the portion $33c_1$ of the light-emitting layer 33c corresponding to the insulating portion 35 becomes an area not electrically connected.

Next, the cathode 34 is formed so as to cover the organic layer 33 and the bank 14. With this configuration, the first organic EL element 30 is formed in the display area D1, while the first alignment mark A1 having the second organic EL element 40 is formed in the non-display area D2. Thereafter, the sealing film 18 is formed so as to cover an upper surface of the cathode 34.

Next, the second substrate 20 is provided above the light-emitting layer 33c. First, the adhesion layer 19 for bonding the first substrate 10 and the second substrate 20 together is previously provided either on the upper surface of the first substrate 10 or on a lower surface of the second substrate 20. In the embodiment, the adhesion layer 19 is provided on the second substrate 20 side.

Next, alignment of the first substrate 10 with the second substrate 20 is performed while causing the first alignment marks A1 to emit light. Specifically, for example, this alignment is performed in the following steps.

First, the second substrate 20 provided with the adhesion layer 19 and the first substrate 10 formed with the sealing film 18 are provided to face each other in a bonding apparatus (not shown). Next, the probe 50 is connected to the probe contact 4 to apply a voltage. Due to this, electricity is supplied from the probe contact 4 to the anode 32 and the cathode 34 via the wire 5, causing the light-emitting layer 33c (the alignment mark A1) to emit light.

In this light emission of the alignment mark A1, since the portion $33c_1$ of the light-emitting layer 33c is not electrically connected to the anode 32 in an area where the insulating portion 35 is disposed on the anode 32, the portion $33c_1$ of the light-emitting layer 33c is a non-light-emitting area.

Next, in a state where the light-emitting layers 33c of the first alignment marks A1 are caused to emit light, alignment of the second substrate 20 is performed so that each of the second alignment marks A2 is located corresponding to the first alignment mark A1. Specifically, for example, the alignment is performed by the viewer by confirming, through a camera for alignment 51, that the second alignment mark A2 (the opening 23a) is located in plan view inside the outer periphery A11 of the first alignment mark A1.

In this alignment, when the viewer views the alignment mark A1 through the camera for alignment 51 from the plan-view direction, a portion of the light emitted from the alignment mark A1 transmits through the second alignment mark A2, while the other portion of the light is blocked at an area where the first alignment mark A1 and the second light-impermeable film 23 overlap each other. Therefore, the viewer can visually recognize that the second alignment mark A2 is located corresponding to the first alignment mark A1.

Moreover, since the portion $33c_1$ of the light-emitting layer $33c$ does not emit light, the viewer can visually recognize the portion $33c_1$ of the light-emitting layer $33c$ by causing the alignment mark A1 to emit light. The viewer may perform alignment so that the portion $33c_1$ of the light-emitting layer $33c$ is located inside the opening 23a of the second alignment mark A2. Moreover, alignment may be performed mechanically. For example, an image of the second alignment mark A2 and its surroundings is captured by the camera for alignment 51, and the boundary between a high luminance portion and a low luminance portion is read by an apparatus having an image analysis function. In this case, there are, for example, two boundaries read by the image analysis function: a first boundary is the boundary between the portion $33c_1$ formed at a portion of the light-emitting layer $33c$ of the first alignment mark A1 and the first alignment mark A1; and a second boundary is the opening 23a of the second alignment mark A2. By reading information on the boundaries with the image analysis function in this manner, the positions of the portion $33c_1$ and the opening 23a become apparent. Due to this, alignment can be performed mechanically by the apparatus having an image analysis function.

After this alignment of the first substrate 10 with the second substrate 20, the sealing film 18 is adhered to the adhesion layer 19, whereby the first substrate 10 and the second substrate 20 are bonded together. Next, the probe 50 is removed from the probe contact 4 to stop the light emission of the alignment mark A1. After this, the adhesion layer 19 is cured to adhere the first substrate 10 to the second substrate 20, whereby the organic EL display device 1 in the embodiment of the invention is completed.

As described above, according to the method of manufacturing the organic EL display device 1 according to the embodiment of the invention, the second alignment marks A2 are disposed in the non-display area D2, and the alignment of the first substrate 10 with the second substrate 20 is performed while causing the first alignment marks A1 to emit light. Therefore, in the alignment, there is no need to irradiate the first substrate 10 with light from the side opposite to the camera for alignment 51.

Hence, compared to a method of manufacturing an organic EL display device not having the configuration, the manufacturing process can be simplified without reducing the accuracy of alignment of the first substrate 10 with the second substrate 20.

Moreover, according to the embodiment, there is no need to secure a light-transmitting area around the second alignment mark A2. Accordingly, compared to a method of manufacturing an organic EL display device not having the configuration, the organic EL display device 1 having the non-display area D2 with a narrow width can be manufactured. Therefore, it is possible to realize the organic EL display device 1 with a narrow edge.

Moreover, according to the embodiment, the method includes: the step of disposing the first insulating film lie on the first substrate 10; the step of disposing, on the first insulating film lie, the wire 5 connected to the anode 32; the step of disposing the second insulating film $11f$ on the wire 5; and the step of disposing the light-emitting layer $33c$ on the anode 32. Therefore, by supplying electricity from the probe contact 4 to the anode 32 via the wire 5, the light-emitting layer $33c$ of the first alignment mark A1 can be caused to emit light.

Moreover, according to the embodiment, since the second alignment mark A2 is formed of the opening 23a disposed in the second light-impermeable film 23, the light emitted from the first alignment mark A1 transmits through the opening 23a. Therefore, the viewer can visually recognize that the second alignment mark A2 is located in plan view at a position corresponding to the first alignment mark A1.

Moreover, the alignment of the first substrate 10 with the second substrate 20 is performed so that the opening 23a is located in plan view inside the outer periphery A11 of the first alignment mark A1. Therefore, compared to a method of manufacturing an organic EL display device not having the configuration, it is possible to manufacture the organic EL display device 1 in which the accuracy of bonding between the first substrate 10 and the second substrate 20 is high. Moreover, since the accuracy of bonding between the first substrate 10 and the second substrate 20 is high, it is possible to prevent the occurrence of a defect of the organic EL display device 1 due to color mixture or the like.

Further, in the step of disposing the first alignment mark A1, the insulating portion 35 is disposed so as to cover a portion of the anode 32, and alignment is performed so that the insulating portion 35 is located inside the opening 23a. Therefore, compared to a method of manufacturing an organic EL display device not having the configuration, it is possible to realize the organic EL display device 1 in which the accuracy of bonding between the first substrate 10 and the second substrate 20 is high.

Moreover, in the method of manufacturing the organic EL display device 1 in the embodiment, since the first organic EL element is disposed on the reflection film 31, the light emitted from the light-emitting layer $33c$ to the first substrate 10 side is reflected by the reflection film 31 and reflected to the second substrate 20 side. Therefore, compared to a method of manufacturing an organic EL display device not having the configuration, the viewer can visually recognize easily the first alignment mark A1 and the second alignment mark A2 in alignment.

Moreover, since the reflection film 31 is disposed, the light incident from the outside of the second substrate 20 is reflected by the reflection film 31 and not transmitted downward through the first substrate 10. Therefore, it is possible to prevent the occurrence of a light-transmitting point in the non-display area D2.

While there have been described what are at present considered to be certain embodiments of the invention, it will be understood that various modifications may be made thereto, and it is intended that the appended claim cover all such modifications as fall within the true spirit and scope of the invention.

What is claimed is:
1. An organic EL display device comprising:
a first substrate;
a second substrate disposed above the first substrate and having a display area and a non-display area; and
a light-emitting layer disposed between the display area and the first substrate, wherein a first alignment mark having the light-emitting layer is disposed between the non-display area and the first substrate, and a second alignment mark is disposed on the second substrate at a position corresponding to the first alignment mark.

2. The organic EL display device according to claim 1, wherein a light-impermeable film is disposed in the non-display area, and the second alignment mark is formed of an opening disposed in the light-impermeable film.

3. The organic EL display device according to claim 2, wherein the opening is located in plan view inside an outer periphery of the first alignment mark.

4. The organic EL display device according to claim 1, wherein the first alignment mark has an electrode underlying the light-emitting layer.

5. The organic EL display device according to claim 4, wherein a portion of the light-emitting layer of the first alignment mark is not electrically connected to the electrode.

6. The organic EL display device according to claim 4 further comprising, between the first substrate and the electrode:

a first insulating film;

a wire disposed on the first insulating film and connected to the electrode; and a second insulating film disposed on the wire.

7. The organic EL display device according to claim 6, wherein a power supply supplying electricity to the electrode via the wire is disposed.

8. The organic EL display device according to claim 4, wherein the first alignment mark has a reflection film underlying the electrode.

9. A method of manufacturing an organic EL display device comprising the steps of:

disposing, on a first substrate, a first alignment mark having a light-emitting layer; and providing, on the light-emitting layer, a second substrate disposed with a second alignment mark at a position corresponding to the first alignment mark and having a display area and a non-display area, wherein in the step of disposing the first alignment mark, the first alignment mark is disposed in an area corresponding to the non-display area, and in the step of providing the second substrate on the light-emitting layer, alignment of the second substrate is performed while causing the first alignment mark to emit light.

10. The method of manufacturing the organic EL display device according to claim 9, wherein the alignment is performed so that an opening, as the second alignment mark, in a light-impermeable film disposed in the non-display area is located in plan view inside an outer periphery of the first alignment mark.

11. The method of manufacturing the organic EL display device according to claim 10 further comprising, in the step of disposing the first alignment mark, the steps of:

disposing an electrode on the first substrate;

disposing an insulator covering a portion of the electrode; and disposing the light-emitting layer so as to cover an upper surface of the electrode and the insulator, wherein the alignment is performed so that the insulator is located inside the opening.

\* \* \* \* \*